US00RE44986E

(19) United States
(12) Reissued Patent
Zapilko et al.

(10) Patent Number: US RE44,986 E
(45) Date of Reissued Patent: Jul. 1, 2014

(54) METHOD FOR POLISHING A SEMICONDUCTOR WAFER

(75) Inventors: Clemens Zapilko, Burghausen (DE); Thomas Jaeschke, Burgkirchen (DE); Makoto Tabata, Burghausen (DE); Klaus Roettger, Bachmehring (DE)

(73) Assignee: Siltronic AG, Munich (DE)

(21) Appl. No.: 13/553,133

(22) Filed: Jul. 19, 2012

Related U.S. Patent Documents

Reissue of:
(64) Patent No.: 8,157,617
Issued: Apr. 17, 2012
Appl. No.: 12/542,920
Filed: Aug. 18, 2009

(30) Foreign Application Priority Data

Sep. 3, 2008 (DE) ..... 10 2008 045 534

(51) Int. Cl.
*B24B 1/00* (2006.01)
(52) U.S. Cl.
USPC ..... 451/8; 451/41; 451/63; 438/691
(58) Field of Classification Search
USPC ..... 451/8, 41, 57, 63; 438/690–692
See application file for complete search history.

(56) References Cited

U.S. PATENT DOCUMENTS

| | | | | |
|---|---|---|---|---|
| 5,043,044 A | 8/1991 | Hattori et al. | | |
| 5,821,166 A | 10/1998 | Hajime et al. | | |
| 5,916,016 A * | 6/1999 | Bothra | ..... | 451/398 |
| 6,352,927 B2 | 3/2002 | Kishimoto | | |
| 7,582,221 B2 | 9/2009 | Netsu et al. | | |
| 2003/0022495 A1 * | 1/2003 | Netsu et al. | ..... | 438/689 |

FOREIGN PATENT DOCUMENTS

| | | | | |
|---|---|---|---|---|
| EP | 1 513 192 A1 | 3/2005 | | |
| JP | 06224164 A | 8/1994 | | |
| JP | 2009-262762 | 10/1997 | | |
| JP | 2005-306680 | 4/2005 | | |
| JP | 2005306680 A * | 11/2005 | ..... | C30B 25/02 |
| JP | 2007088193 A | 5/2007 | | |
| JP | 2008-140878 | 6/2008 | | |
| WO | 02/35593 A1 | 5/2002 | | |

OTHER PUBLICATIONS

English language machine translation of JP 2005-3066680, published Apr. 11, 2005.*

* cited by examiner

*Primary Examiner* — Maurina Rachuba
(74) *Attorney, Agent, or Firm* — Brooks Kushman P.C.

(57) ABSTRACT

Semiconductor wafers are CMP polished by polishing the rear side of the semiconductor wafer by means of CMP with a material removal with a profile along the diameter of the wafer wherein material removal is higher at the center than at the edge of the rear side; and polishing the front side of the wafer by means of CMP with a material removal with a profile along the diameter of the wafer wherein material removal is lower in the center of the front side than in an edge region of the front side.

8 Claims, 2 Drawing Sheets

METHOD FOR POLISHING A SEMICONDUCTOR WAFER

Matter enclosed in heavy brackets [ ] appears in the original patent but forms no part of this reissue specification; matter printed in italics indicates the additions made by reissue.

CROSS-REFERENCE TO RELATED APPLICATIONS

This application claims priority to German application DE 10 2008 045534.2 filed Sep. 3, 2008, which is herein incorporated by reference.

BACKGROUND OF THE INVENTION

1. Field of the Invention

The invention relates to a method for polishing a semiconductor wafer by means of chemical mechanical polishing (CMP).

2. Background Art

CMP is a single-side polishing that is usually used to reduce the roughness of the front side of a semiconductor wafer. It is therefore also referred to as mirror polishing. During CMP, the semiconductor wafer is pressed on the side to be polished against a rotating polishing cloth by a rotating polishing head and is smoothed in the presence of a polishing agent supplied. The material removal brought about during polishing depends, inter alia, on the pressure with which the semiconductor wafer is pressed against the polishing cloth. There is also the possibility of choosing the polishing pressure to be different in different zones, thereby bringing about a material removal which leads to a nonuniform profile when the material removal is viewed along the diameter of the semiconductor wafer. Pressure zones can be established for example with the aid of pressure chambers or pressure rings. A polishing head having a carrier which enables a subdivision into pressure zones is described for example in U.S. Pat. No. 5,916,016. The CMP can accordingly also be used to influence the geometry of the semiconductor wafer in a targeted manner, that is to say the parameters of the semiconductor wafer which describe the local and global flatness.

Alongside CMP, DSP ("double side polishing") plays an important part in the polishing of semiconductor wafers. DSP involves generally a plurality of semiconductor wafers being polished simultaneously. During the DSP, a semiconductor wafer lies between two polishing plates provided with polishing cloth in a cutout of a carrier and is polished on both sides with the aid of a polishing agent supplied. DSP has the task, in particular, of eliminating damage in the region of the surface that has remained after shaping mechanical machining by lapping and/or grinding of the semiconductor wafer. The material removal is significantly higher in the case of DSP, usually having total removal of 10 to 30 μm more than that in the case of CMP. Therefore, DSP is often also referred to as stock removal polishing.

Standardized parameters are available for the quantitative characterization of the geometry of semiconductor wafers. This also applies to the edge region of the front side of the semiconductor wafer, where the front side is usually taken to mean that side of a semiconductor wafer which is used as a basis for the integration of electronic components.

The manufacturers of electronic components also endeavor to include the edge region as comprehensively as possible in the usable area FQA ("Fixed Quality Area").

Accordingly, the specified permitted edge exclusion EE is becoming ever smaller. At the present time demanding specifications permit only an edge exclusion of 1 mm.

Unevennesses can be described by the parameter SFQR. SFQR denotes the local flatness in a measurement zone having a specific dimensioning, for example an area of 20 mm×20 mm, to be precise, in the form of the maximum height deviation of the front side of the semiconductor wafer in the measurement zone with respect to a reference area having the same dimensioning that is obtained by error square minimization. Partial sites are measurement zones in the edge region which are no longer fully part of the FQA, but the center of which still lies in the FQA. The parameter PSFQR denotes the local flatness in partial sites, as does the parameter ESFQR. The latter is based on a more comprehensive metric.

Alongside the local flatness, it is always necessary to also take into account the global flatness of the front side of the semiconductor wafer. Standardized parameters for describing the global flatness are GBIR and SBIR, which correlate with this value. Both parameters express the maximum height deviation of the front side relative to a rear side—assumed to be ideally flat—of the semiconductor wafer and differ in that the FQA is used for calculation in the case of GBIR and the area restricted to a measurement zone is used for calculation in the case of SBIR.

Definitions of the abovementioned parameters and descriptions of methods for measuring said parameters are contained in the relevant SEMI standards, in particular in the M1, M67 and M1530 standards.

The thickness of a semiconductor wafer polished by means of DSP usually decreases significantly toward the edge. This edge roll-off can impair the global flatness and the local flatness in partial sites. It is desirable, therefore, to limit the edge roll-off as far as possible to the region of the edge exclusion.

US2003/0022495 A1 proposes, for reducing the edge roll-off, firstly polishing the rear side of the semiconductor wafer in such a way that a reference plane arises. For this purpose, the front side is sucked against a stiff carrier and a material removal amounting to preferably 3 to 8 μm is brought about on the rear side. Afterward, the front side of the semiconductor wafer is polished.

SUMMARY OF THE INVENTION

The object of the present invention is to provide a method for polishing a semiconductor wafer which leads to a significant improvement both in the global flatness and in the local flatness, in particular in the edge region of the front side of the semiconductor wafer. These and other objects are obtained by a two stage polishing wherein first the back side is CMP polished with a higher removal rate toward the center of the wafer, and then the front side is CMP polished with a higher removal rate near the edge region.

DETAILED DESCRIPTION OF THE PREFERRED EMBODIMENT(S)

Figure 1:
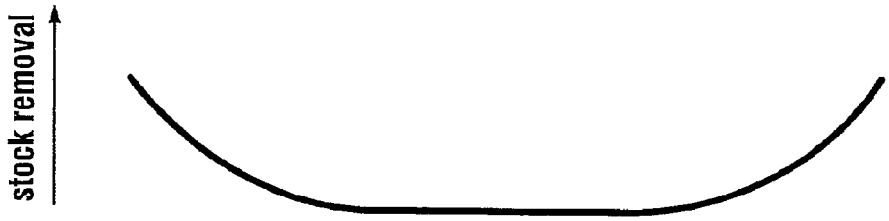
FIGS. 1 and 2 illustrate two different concave CMP polishing removal profiles for the front side CMP in accordance with two embodiments of the subject invention.
Figure 2:
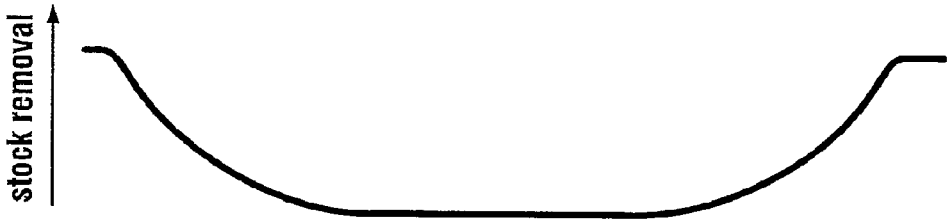
Figure 3:
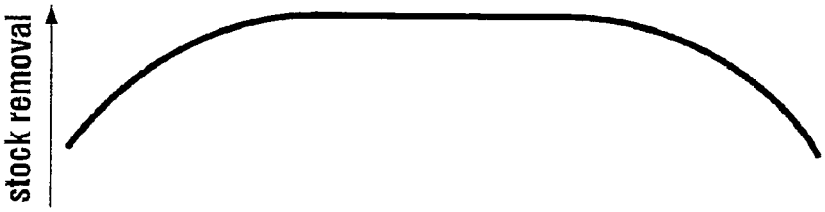
FIGS. 3 and 4 illustrate two different convex CMP polishing removal profiles for the rear side CMP in accordance with two embodiments of the subject invention.
Figure 4:
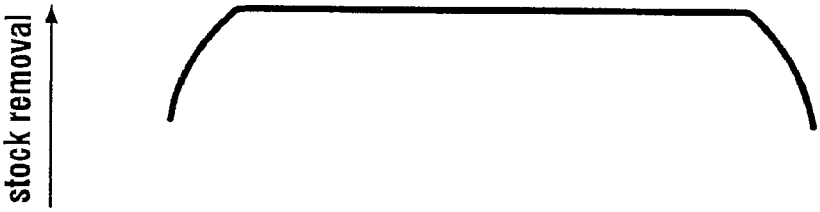

The invention thus relates to a method for polishing a semiconductor wafer having a front side and a rear side, comprising: polishing the rear side of the semiconductor wafer by means of CMP with a material removal with a profile along the diameter of the semiconductor wafer according to which the material removal is higher in a center region of the rear side than in an edge region of the rear side; and polishing the front side of the semiconductor wafer by means of CMP with a material removal with a profile along the diameter of the semiconductor wafer according to which the material removal is lower in a center region of the front side than in an edge region of the front side.

The CMP of the rear side, which is performed in such a way that more material is removed in the center region than in the edge region, leads directly to an improvement in the edge geometry, in particular to an improvement in the parameters PSFQR and ESFQR. However, it also leads to a deterioration in the global geometry, in particular in the parameters GBIR and SBIR, since the difference in thickness between the center region and the edge region of the semiconductor wafer increases owing to the nonuniform material removal. The subsequent CMP of the front side which is performed in such a way that less material is removed in the center region than in the edge region, primarily has the effect that the global geometry becomes better again, without impairing the edge geometry. Improvements in all parameters, such as GBIR, SBIR, ESFQR and PSFQR, result as a consequence. The improvement in the geometry of the semiconductor wafer that can be achieved by means of the method is accomplished even when an edge exclusion of just 1 mm is required.

The center region comprises the center of the semiconductor wafer and a circular area having a radius amounting at least 50% of the radius of the semiconductor wafer. The edge region extends from the edge of the semiconductor wafer in the direction of the center thereof and has a width amounting to at least 5% of the radius of the semiconductor wafer.

Preferably, the profile of the material removal which is produced when polishing the rear side of the semiconductor wafer by means of CMP has a course that is mirror-inverted with respect to the course of the profile of the material removal produced when polishing the front side of the semiconductor wafer by means of CMP. In order to achieve this it is advantageous to determine a target profile after polishing the rear side of the semiconductor wafer by means of CMP, the target profile describes the material removal intended to be obtained when polishing the front side by means of CMP. The target profile is determined by measuring, after the CMP of the rear side, the height deviation of the rear side from a plane along the diameter of the semiconductor wafer and equating the course of the height deviation to the course of the target profile. The implementation of the target profile during the subsequent CMP of the front side is achieved by means of pressure zones which apply different pressures to the semiconductor wafer during the CMP of the front side in such a way as to bring about a material removal with a profile corresponding to the target profile.

The material removal of the CMP amounts in total (removal from the rear side and removal from the front side) to not more than 1.5 μm. Therefore, the method is also particularly economical. During the CMP of the rear side, the material removal is preferably 0.2 to 0.8 μm in the center region of the rear side. The material removal is preferably 0.02 to 0.2 μm lower in the edge region of the rear side. During the CMP of the front side, the material removal is preferably 0.2 to 0.8 μm in the center region of the front side. The material removal is preferably 0.02 to 0.2 μm higher in the edge region of the front side.

The profile of the material removal produced when polishing the rear side by means of CMP preferably has a convex course, and the profile of the material removal produced when polishing the front side by means of CMP preferably has a concave course. The profile of the material removal need not be strictly convex or strictly concave, respectively. Thus, by way of example, a course is also possible in which the maximum of the material removal is already attained before the edge of the semiconductor wafer, or a course in which a significant decrease or a significant increase in the material removal is only attained in a region of the rear side or of the front side whose distance from the center of the semiconductor wafer is at least 55% of the radius of the semiconductor wafer.

FIGS. 1 to 4 show in each case two examples of removal profiles, to be precise profiles having a course that tends to be concave (FIGS. 1 and 2) for the CMP of the front side and profiles having a course that tends to be convex (FIGS. 3 and 4) for the CMP of the rear side.

The method according to the invention is preferably carried out with semiconductor wafers that have previously been subjected to a DSP. Moreover, further CMP steps can be carried out in order to polish the rear side and/or the front side. At least one further CMP of the front side of the semiconductor wafer is particularly preferred, which is carried out after the first CMP of the front side with the aim of reducing the roughness of the front side.

The success of the invention is shown below on the basis of an example and on the basis of comparative examples:

Example 1

A semiconductor wafer composed of silicon having a diameter of 300 mm, after a DSP, was subjected first to a CMP of the rear side and then to a CMP of the front side. A polishing machine of the type Reflexion LK CMP from the manufacturer Applied Materials, USA was available for carrying out the CMP.

A material removal with a profile that tends to be convex was chosen for the CMP of the rear side. The material removal in the center was 0.65 μm, and that in the edge region at a position at a distance of 2 mm from the edge was 0.55 μm.

A material removal with a profile that tends to be concave was chosen for the CMP of the front side. The material removal in the center was 0.25 μm, and that in the edge region at a position at a distance of 2 mm from the edge was 0.35 μm.

Figure 5:
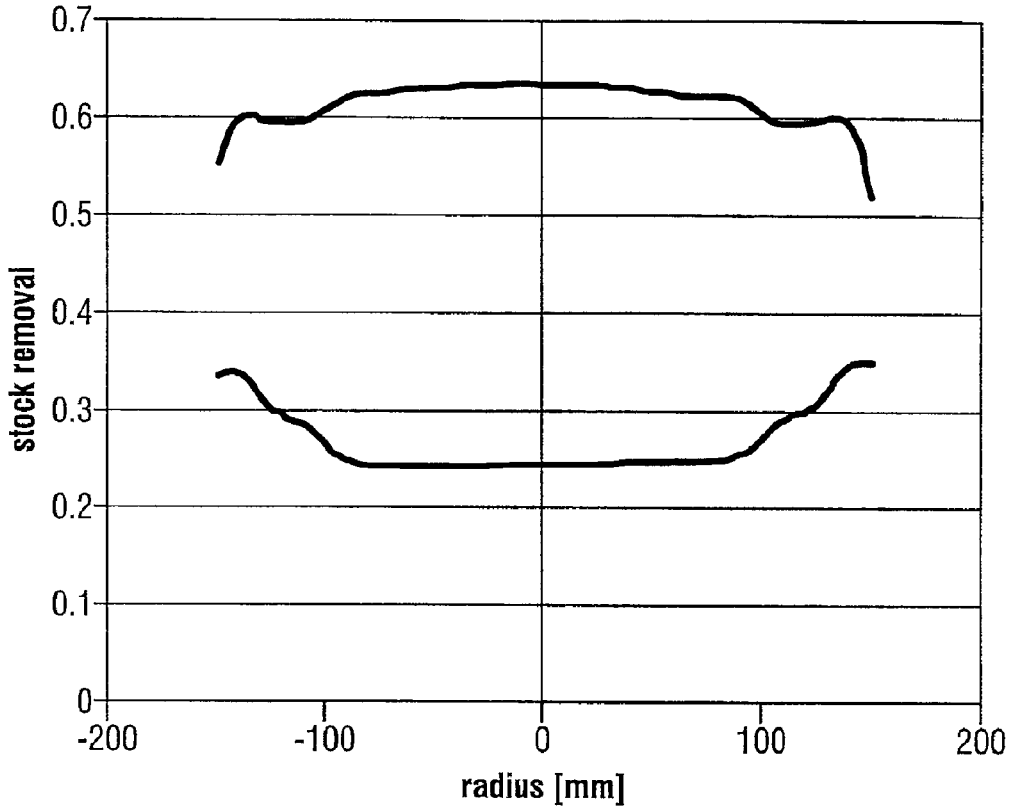
FIG. 5 illustrates front and rear CMP removal profiles for the wafer polished in accordance with Example 1.

The measured removal profiles are illustrated in FIG. 5.

The geometry parameters $ESFQR_{avg}$, $PSFQR_{max}$, $SBIR_{max}$, GBIR and $SFQR_{max}$ are compiled in Table 1 below, taking account of an edge exclusion of 1 mm. The specified values (Δ) indicate the change in the respective parameter before and after the CMP of the rear side, and before and after the CMP of the rear side and the CMP of the front side.

TABLE 1

| | Δ (CMP of the rear side) [μm] | Δ (CMP of the rear side and of the front side) [μm] |
|---|---|---|
| $ESFQR_{avg}$ | 0.044 | 0.042 |
| $PSFQR_{max}$ | 0.023 | 0.022 |
| $SBIR_{max}$ | −0.003 | 0.032 |
| GBIR | −0.056 | 0.017 |
| $SFQR_{max}$ | 0.025 | 0.022 |

The CMP of the rear side led to a significant improvement in the average ESFQR by 44 nm. The parameter PSFQR improved by 23 nm. By contrast, SBIR and GBIR decreased, namely by 3 nm and by 56 nm, respectively. All the geometry parameters considered had been improved after the CMP of the rear side and of the front side.

Comparative Example 1

For comparison, a further DSP-polished semiconductor wafer was subjected first to a CMP of the rear side and then to a CMP of the front side. A material removal with a profile that tends to be convex was chosen for the CMP of the rear side. The material removal in the center was 0.65 μm, and that in the edge region at a position at a distance of 2 mm from the edge was 0.58 μm. A material removal with a profile that likewise tends to be convex was chosen for the CMP of the front side, with the same properties that were obtained during the CMP of the rear side.

The result of the geometry measurement is compiled in Table 2 below:

TABLE 2

| | Δ (CMP of the rear side) [μm] | Δ (CMP of the rear side and of the front side) [μm] |
|---|---|---|
| $ESFQR_{avg}$ | −0.015 | 0.01 |
| $PSFQR_{max}$ | −0.011 | 0.004 |
| $SBIR_{max}$ | 0.026 | −0.075 |
| GBIR | 0.032 | −0.13 |
| $SFQR_{max}$ | −0.012 | 0.011 |

Practically no improvement of the geometry parameters could be achieved with the chosen configuration of the CMP of the rear side and the front side of the semiconductor wafer. This also held true for a modified configuration of the experiment when a material removal with a profile that tends to be concave was chosen in each case for the CMP of the rear side and of the front side.

Comparative Example 2

For comparison, a further DSP-polished semiconductor wafer was subjected first to a CMP of the rear side and then to a CMP of the front side. A uniform material removal in the region of 0.4 μm was chosen for the CMP of the rear side, such that the profile was essentially flat. A material removal in the region of 0.45 μm with a profile that tends to be convex was chosen for the CMP of the front side.

The result of the geometry measurement is compiled in Table 3 below:

TABLE 3

| | Δ (CMP of the rear side) [μm] | Δ (CMP of the rear side and of the front side) [μm] |
|---|---|---|
| $ESFQR_{avg}$ | 0.002 | 0.004 |
| $PSFQR_{max}$ | 0.001 | 0.003 |
| $SBIR_{max}$ | −0.003 | −0.023 |
| GBIR | 0.007 | −0.002 |
| $SFQR_{max}$ | 0 | 0.011 |

The CMP of the rear side with the material removal of 0.4 μm and the flat profile had hardly any effects on the geometry of the semiconductor wafer. The parameters fluctuated by less than 10 nm.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for polishing a semiconductor wafer having a front side and a rear side, comprising:

polishing the rear side of the semiconductor wafer by means of CMP with a material removal with a profile along the diameter of the semiconductor wafer according to which material removal is higher in a center region of the rear side than in an edge region of the rear side, *wherein the material removal is 0.2 to 0.8 μm in the center region of the rear side and is 0.02 to 0.2 μm lower in the edge region of the rear side*; [and]

polishing the front side of the semiconductor wafer by means of CMP with a material removal with a profile along the diameter of the semiconductor wafer according to which material removal is lower in a center region of the front side than in an edge region of the front side, *wherein the material removal is 0.2 to 0.8 μm in the center region of the front side and is 0.02 to 0.2 μm higher in the edge region of the frontside; and*

*polishing the semiconductor wafer by means of DSP, wherein the DSP is carried out before polishing the rear side of the semiconductor wafer by means of CMP*.

[2. The method of claim 1, wherein the material removal is 0.2 to 0.8 μm in the center region of the rear side and is 0.02 to 0.2 μm lower in the edge region of the rear side.]

[3. The method of claim 1, wherein the material removal is 0.2 to 0.8 μm in the center region of the front side and is 0.02 to 0.2 μm higher in the edge region of the front side.]

4. The method of claim 1, wherein the profile of the material removal which is produced when [publishing] *polishing* the rear side of the semiconductor wafer by means of CMP has a course that is mirror-inverted with respect to the course of the profile of the material removal produced when polishing the front side of the semiconductor wafer by means of CMP.

[5. The method of claim 2, wherein the profile of the material removal which is produced when publishing the rear side of the semiconductor wafer by means of CMP has a course that is mirror-inverted with respect to the course of the profile of the material removal produced when polishing the front side of the semiconductor wafer by means of CMP.]

[6. The method of claim 3, wherein the profile of the material removal which is produced when publishing the rear side of the semiconductor wafer by means of CMP has a course that is mirror-inverted with respect to the course of the profile of the material removal produced when polishing the front side of the semiconductor wafer by means of CMP.]

7. The method of claim 1, wherein a target profile of the material removal for polishing the front side by means of CMP is determined after polishing the rear side of the semiconductor wafer by means of CMP, by measuring the height deviation of the rear side from a plane along the diameter of the semiconductor wafer and equating the course of the height deviation to the course of the target profile.

[8. The method of claim 2, wherein a target profile of the material removal for polishing the front side by means of CMP is determined after polishing the rear side of the semiconductor wafer by means of CMP, by measuring the height deviation of the rear side from a plane along the diameter of the semiconductor wafer and equating the course of the height deviation to the course of the target profile.]

[9. The method of claim 3, wherein a target profile of the material removal for polishing the front side by means of CMP is determined after polishing the rear side of the semiconductor wafer by means of CMP, by measuring the height deviation of the rear side from a plane along the diameter of the semiconductor wafer and equating the course of the height deviation to the course of the target profile.]

10. The method of claim 4, wherein a target profile of the material removal for polishing the front side by means of CMP is determined after polishing the rear side of the semiconductor wafer by means of CMP, by measuring the height deviation of the rear side from a plane along the diameter of the semiconductor wafer and equating the course of the height deviation to the course of the target profile.

11. The method of claim 1, wherein the profile of the material removal produced when polishing the rear side by means of CMP has a convex course and the profile of the material removal produced when polishing the front side by means of CMP has a concave course.

12. The method of claim 1, comprising at least one further CMP of the front side of the semiconductor wafer, by means of which the roughness of the front side is reduced.

[13. The method of claim 1, comprising first polishing the semiconductor wafer by means of DSP, wherein the DSP is carried out before the CMP of the rear side of the semiconductor wafer.]

*14. The method of claim 1, wherein the total amount of material removal in the steps of polishing the rear side and the front side of the semiconductor wafer is not more than 1.5 μm.*

*15. The method of claim 1, wherein a material removal profile during polishing the front side of the semiconductor wafer is established by applying different pressures to edge and central regions of the semiconductor wafer during polishing.*

* * * * *